United States Patent [19]
Ayel

[11] 3,935,059
[45] Jan. 27, 1976

[54] METHOD OF PRODUCING SINGLE CRYSTALS OF SEMICONDUCTOR MATERIAL BY FLOATING-ZONE MELTING

[75] Inventor: Michel Ayel, Caen, France

[73] Assignee: U.S. Philips Corporation, New York, N.Y.

[22] Filed: June 28, 1972

[21] Appl. No.: 267,178

Related U.S. Application Data

[63] Continuation of Ser. No. 56,631, July 20, 1970, abandoned.

[52] U.S. Cl............ 156/620; 13/DIG. 1; 23/273 SP; 219/10.43; 23/301 SP
[51] Int. Cl.²........................................ B01J 17/10
[58] Field of Search................. 23/301 SP, 273 SP; 13/DIG. 1; 219/10.43

[56] References Cited
UNITED STATES PATENTS

| | | | |
|---|---|---|---|
| 2,905,798 | 9/1959 | Freutel | 23/273 |
| 3,030,194 | 4/1962 | Emeis | 23/301 |
| 3,275,417 | 9/1966 | Hunt | 23/301 |
| 3,342,970 | 9/1967 | Emeis | 23/273 |
| 3,644,097 | 2/1972 | Knudsen | 23/301 |
| 3,649,210 | 3/1972 | Keller | 23/273 |

FOREIGN PATENTS OR APPLICATIONS

| | | | |
|---|---|---|---|
| 829,422 | 3/1960 | United Kingdom | 23/301 |
| 1,108,543 | 4/1960 | France | 23/301 |

Primary Examiner—Norman Yudkoff
Assistant Examiner—S. J. Emery
Attorney, Agent, or Firm—Frank R. Trifari; Ronald L. Drumheller

[57] ABSTRACT

In a floating-zone melting process for producing single crystals of a semi-conductor material from a semi-conductor rod and a seed crystal, the rod is heated by high-frequency induction from an inductance coil which is spaced from a short-circuited annular conductor. The spacing between the inductance coil and the short-circuited conductor is varied during passage of the molten zone to correspond with variations in the diameter of the growing crystal.

2 Claims, 7 Drawing Figures

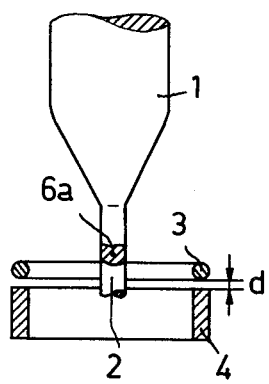
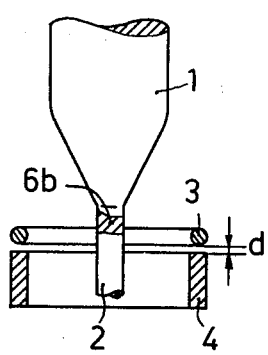
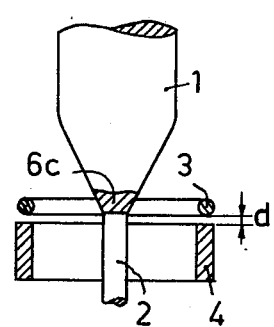
Fig.1a     Fig.1b     Fig.1c
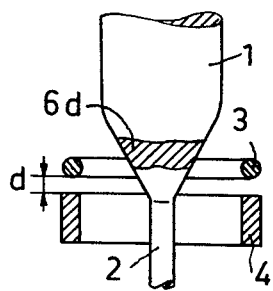
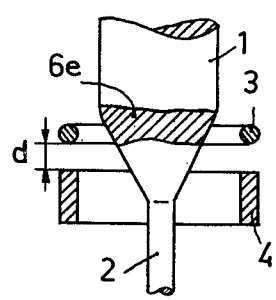
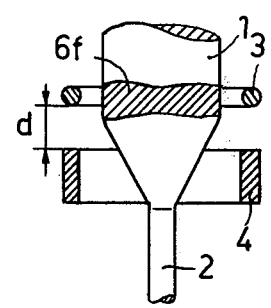
Fig.1d     Fig.1e     Fig.1f
*INVENTOR.*
BY    MICHEL AYEL
AGENT

METHOD OF PRODUCING SINGLE CRYSTALS OF SEMICONDUCTOR MATERIAL BY FLOATING-ZONE MELTING

This is a continuation of application Ser. No. 56,631, filed July 20, 1970 now abandoned.

The invention relates to a method of producing single crystals of semiconductor material by floating-zone melting starting from a semiconductor rod and a seed crystal, a molten zone being passed from the seed crystal through the rod so that from the seed crystal a rodshaped crystal starts growing, the diameter of the growing crystal being gradually varied at least temporarily, while the molten zone is heated by high-frequency induction with the aid of an inductance coil in the presence of a short-circuit ring; the invention furthermore relates to a semiconductor single crystal produced by said method and to a device for carrying said method into effect. Such a method is disclosed, for example, in French Pat. No. 1,415,880.

In a known method of producing single crystals by floating-zone melting starting from a rod of semiconductor material, which may be polycrystalline, a molten zone is provided at one end of the rod between the material of the rod and a single-crystal seed arranged at said end.

Subsequently this molten zone is passed through the rod so that the single crystal grows gradually from the seed onwards. In general the diameter of the molten zone may differ at the beginning from the diameter of the zone in a later stage of the crystal growth. In order to obtain a satisfactory crystal perfection it is known to start from a seed crystal of small diameter and/or from a portion thereof having a small diameter. In order to improve the crystal perfection it is even desirable to grow first a portion of small diameter. Then the diameter of the growing portion is raised to a value matching the diameters commonly used in the series production of semiconductor devices. In order to ensure a satisfying perfection of the crystal growth during this enlargement of the diameter, it is desirable to enlarge the diameter gradually and over not too large a distance so that the final crystal has the desired diameter over maximum part of its length. Moreover, the displacement of the solidification front has to be uniform.

A difficulty is involved in correctly adapting the quantity of supplied heat to the increase in diameter of the molten zone, also in view of the conditions mentioned above. In addition, particularly in high-frequency inductive heating, the coupling between the high frequency coil and the semiconductor material changes during the variation in diameter.

In a known method it is endeavoured to adapt the quantity of supplied heat to the increase in diameter of the molten zone by gradually varying the value of energization of the high-frequency coil simultaneously with the variation of the rate of displacement of the seed. However, such an adaptation of the energization of the high-frequency coil is very critical and this involves the risk that the increase in diameter and the displacement of the solidification front are performed in a non-reproducible manner.

The present invention has for its object inter alia to provide a simple precaution to obtain a smooth adaptation of the conditions for such a gradual variation in diameter of the rod to be crystallized.

According to the invention the method of producing single crystals of semiconductor material by floating-zone melting starting from a semiconductor rod and a seed crystal, in which a molten zone is passed from the seed crystal through the rod so that a rodshaped crystal grows from the seed crystal and the diameter of the growing crystal is gradually varied at least temporarily, and in which the molten zone is heated by high-frequency induction with the aid of an inductance coil in the presence of a short-circuit ring, is characterized in that during the zone-melting process, when the diameter is changed at the passage of the molten zone, the distance between the short-circuit ring and the inductance coil is also varied. This variation is such that at an increase in diameter the distance between the short-circuit ring and the inductance coil is enlarged and at a decrease in diameter said distance is reduced. The displacement of the short-circuit ring relative to the high-frequency coil during the variation in diameter of the molten zone is preferably adjusted so that the load of the inductance coil remains constant. In a further preferred embodiment the displacement of the short-circuit ring relative to the high-frequency coil is programmed in accordance with the displacement of the high-frequency coil relative to the seed crystal.

The invention is particularly suitable for obtaining crystals having few or no dislocations by enlarging the molten one to the desired diameter of the rod, in one phase of the melting process, from a very narrow part of the growing portions associated with the seed crystal or connected with said crystal. In this phase of the zone-melting process the distance between the short-circuit ring and the high-frequency coil is gradually increased. In order to obtain a satisfactory crystal growth and particularly in order to ensure an optimally flat solidification face it is advantageous to arrange the short-circuit ring on the side of the seed crystal viewed from the high-frequency coil.

The invention furthermore relates to a semi-conductor single crystal manufactured by the method embodying the invention. The invention furthermore relates to a device for floating zone-melting of a rod-shaped semiconductor body for carrying out the method embodying the invention, said device comprising a high-frequency coil for inductive heating of the molten zone, means for displacing the high-frequency coil relatively to the rod-shaped body in the direction of length thereof and a short-circuit ring around the rod-shaped body at a given distance from the high-frequency coil. According to the invention the device comprises means for gradually varying the distance between the short-circuit ring and the high-frequency coil during the zone-melting process.

It should be noted that devices for floating-zone melting with the aid of high-frequency inductive heating by means of a high-frequency coil are known to comprise a short-circuit ring on one side at a short distance from the high-frequency coil in order to restrict the field of the coil. It is furthermore known to use such short-circuit rings on either side of the high-frequency coil. In these known devices the distance between the high-frequency coil and the short-circuit ring is fixed in operation. As a matter of course, within the scope of the present invention two short-circuit rings may be employed, which may either of them or both of them be displaceable with respect to the high-frequency coil in operation.

In order to obtain a single crystal rod of semiconductor material having a constant diameter over a large part of its length by floating zone melting with the aid of the device embodying the invention the energization of the high-frequency coil may be adjusted so that a molten zone of appropriate size is obtained in a rod of the desired diameter when the displaceable short-circuit ring is at such a distance from the high-frequency coil that it only slightly affects the field of said coil. At the beginning of the crystal growth from the seed crystal this energization of the coil allows the short-circuit ring to be very near the coil so that the ring absorbs a large quantity of energy of the high-frequency field, whereas a small portion of the energy is employed to form a short molten zone in the growth of a thin rod portion at the seed crystal. When the crystal widens, the short-circuit ring is gradually moved away from the high-frequency coil so that the field effect on the molten zone is gradually increased during the increase in diameter of the crystal up to the desired value.

The invention will be described more fully with reference to the accompanying drawing.

FIGS. 1a to 1f show schematically the relative positions of the high-frequency coil and the short-circuit ring during the passage of the molten zone from the diameter of the seed up to the desired diameter of the rod-shaped single-crystal semiconductor body.

Figure 2:
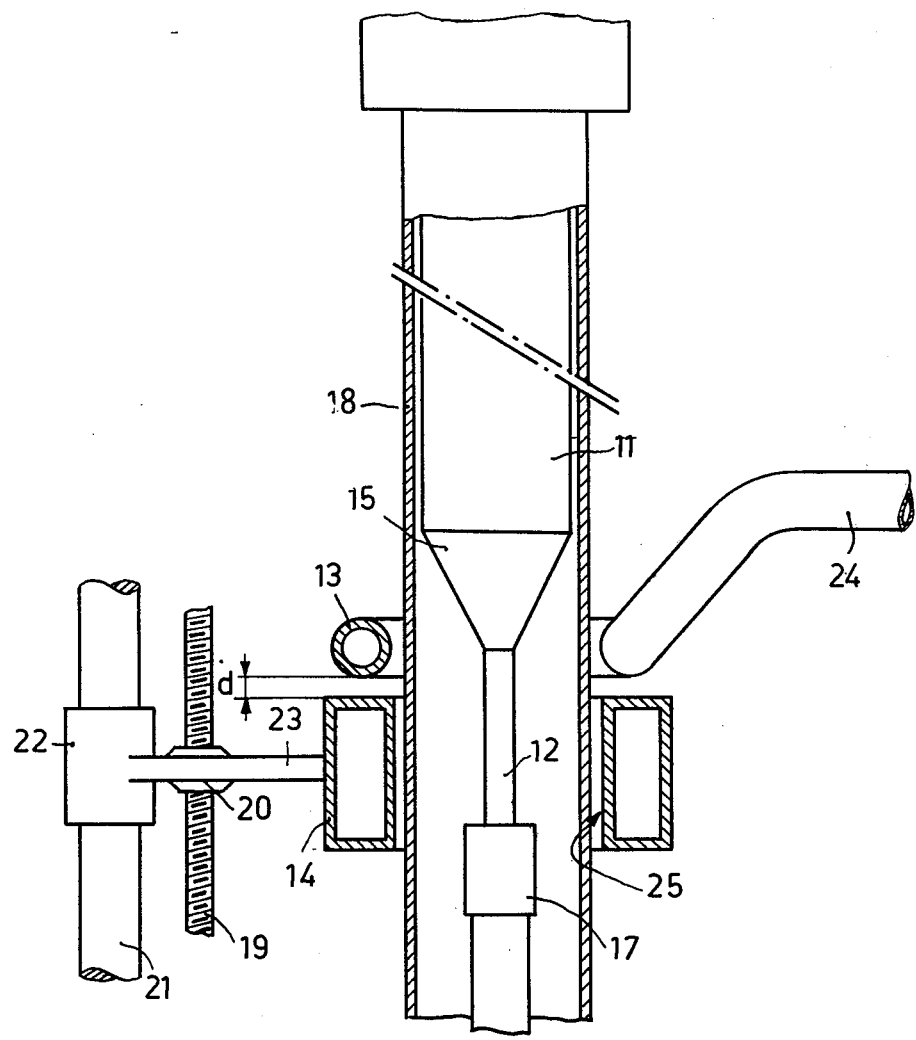
FIG. 2 shows schematically a device for carrying out the method embodying the invention.

Referring to FIGS. 1a to 1f reference numeral 1 designates a rod of the starting material for the production of the single-crystal rod, which starting material may be polycrystalline. Reference numeral 2 designates the seed crystal of much smaller diameter than the rod 1. The high-frequency coil is designated by 3 and it is fed from a high-frequency generator (not shown). Reference numeral 4 designates a short-circuit ring located at a variable distance from the high-frequency coil. In order of succession FIGS. 1a to 1f illustrate consecutive stages of the zone-melting process. The rod 1 of basic material comprises a conical portion tapering towards the seed crystal 2 and a short, cylindrical portion of smaller diameter matching the diameter of the seed. FIG. 1a shows a very small distance $d$ between the high-frequency coil 3 and the short-circuit ring 4, the ring 4 thus compensating to a considerable extent the field effect of the high-frequency coil 3. The effect of the high-frequency field on the molten zone 6a is thus fairly slight so that the molten zone is comparatively short. The high-frequency coil and the short-circuit ring are then gradually moved upwards in common so that the molten zone 6a shifts to the position 6b shown in FIG. 1b. The smaller diameter of the growing portion is maintained and the distance $d$ between the coil 3 and the short-circuit ring 4 has not changed.

When the molten zone has reached the conical portion of the rod 1, so that it is gradually widened, the distance $d$ between the high-frequency coil and the short-circuit ring is gradually enlarged. The energy supplied to the molten zone is thus raised sufficiently for maintaining the molten zone throughout the diameter of the rod. The progression of the molten zone from the position 6c at the beginning of the conical portion via the position 6d to the position 6e is attended by a gradual increase of distance $d$ between the coil 3 and the short-circuit ring 4. The energization of the high-frequency coil 3 can then remain unchanged. In the state illustrated in FIG. 1f the molten zone has reached the desired diameter for crystallizing out the final rod portion of constant diameter as desired. The distance $d$ between the coil 3 and the short-circuit ring 4 is then adjusted to such a high value that the influence of the short-circuit ring on the high-frequency field at the area of the molten zone is practically nil.

The floating-zone melting device shown schematically in FIG. 2 is one embodiment of the invention. The single crystal is produced in a hermetically closed tube having a transparent wall 18. The seed crystal 12 in a holder 17 is brought into contact with the end of a rod 11 of larger diameter. The tube 18 is surrounded by a high-frequency coil 13. The coil 13 is cooled by circulating water. By arms 24, one of which is shown in FIG. 2, both water and high frequency current is passed through the coil.

Beneath the coil 13 a hollow, conductive short-circuit ring 14 is arranged, which is also cooled by circulating water and which is secured to an insulating arm 23. The short-circuit ring 14 also surrounds the tube 18. The insulating arm 23 is provided with a sliding piece 22, which fits slidably around the vertical column 21. The arm 23 is furthermore provided with a nut 20 by means of which the short-circuit ring 14 can be displaced vertically by turning a spindle 19. The short-circuit ring 14 preferably has a rectangular section and its side 25 facing the wall of the tube 18 preferably has a reflecting surface.

By means of the spindle 19 the distance $d$ between the short-circuit ring 14 and the high-frequency coil 13 can be varied and set.

The tube 18 and the high-frequency coil 13 occupy fixed positions; the seed crystal 12 and the rod 11 are adapted to perform in known manner translation and rotation motions. During the passage of the molten zone from the seed crystal 12 through the conical portion 15 of the rod 11 the short-circuit ring 14 is gradually moved away from the coil 13, the distance $d$ being gradually varied in accordance with the variation in diameter of the molten zone. The distance $d$ is gradually varied by rotation of the spindle 19.

When the coil 13 is moved upwardly along the tube 18 for passing the molten zone through the stationary rod, the movement of the ring 14 is coupled with this displacement of the coil 13, for example, by causing the spindle 19 to move together with the coil 13, the distance $d$ being controlled by the rotation of the spindle 19.

Because the short-circuit ring has a deforming effect on the field of the high-frequency coil, small variations of the distance $d$ are sufficient for markedly changing the power absorbed by the ring. For example, in order to enlarge a molten zone from the diameter of a seed of about 7 mms to a rod diameter of about 32 mms, the distance $d$ between the coil 13 traversed by a current of a frequency of about a MHz and the short-circuit ring 14 can be gradually varied from 6 mms to 20 mms.

I claim:

1. In a floating melt zone process for forming a monocrystalline semiconductor rod from a seed crystal in contact with an end of a rod of semiconductor material, wherein the diameter of the rod varies at least over a portion of the length thereof, a method for generating a floating melt zone of substantially constant axial depth moving axially through the rod of varying diameter at a substantially constant axial displacement rate, said method comprising the steps of:

positioning axially with respect to the rod a high frequency inductance coil radiating sufficient energy to generate a floating melt zone of at least the desired axial depth even when positioned over the rod region of maximum diameter;

positioning a short circuit ring axially with respect to the rod;

slowly moving the radiating inductance coil axially with respect to the rod at a substantially constant rate from the end in contact with the seed crystal to the other end; and maintaining the short circuit ring in axial position with respect to the rod at an axial distance from the inductance coil which varies directly with the diameter of the rod at the floating melt zone, whereby the short circuit ring absorbs radiated energy in excess of the amount required to maintain a substantially constant axial depth for the floating melt zone as the floating melt zone travels through the rod at a substantially constant axial displacement rate.

2. A method as defined in claim 1 wherein the short circuit ring is positioned on the trailing side of the moving inductance coil.

* * * * *

UNITED STATES PATENT AND TRADEMARK OFFICE
CERTIFICATE OF CORRECTION

PATENT NO. : 3,935,059
DATED : January 27, 1976
INVENTOR(S) : MICHEL AYEL

It is certified that error appears in the above-identified patent and that said Letters Patent are hereby corrected as shown below:

IN THE TITLE PAGE

Under Section [63] it should read as follows:

[30]  FOREIGN APPLICATION PRIORITY DATA
    July 21, 1969     French..........6924718--

Column 1, line 63, "non-reproducible manner" should be

--uniform and non-reproducible manner--.

Signed and Sealed this eighteenth Day of May 1976

[SEAL]

Attest:

RUTH C. MASON
Attesting Officer

C. MARSHALL DANN
Commissioner of Patents and Trademarks